United States Patent
Schleicher, II et al.

(10) Patent No.: US 7,360,197 B1
(45) Date of Patent: * Apr. 15, 2008

(54) METHODS FOR PRODUCING EQUIVALENT LOGIC DESIGNS FOR FPGAS AND STRUCTURED ASIC DEVICES

(75) Inventors: James G Schleicher, II, Los Gatos, CA (US); Jinyong Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 449 days.

This patent is subject to a terminal disclaimer.

(21) Appl. No.: 11/050,607

(22) Filed: Feb. 3, 2005

(51) Int. Cl.
*G06F 17/50* (2006.01)
(52) U.S. Cl. .......................... 716/18; 716/16
(58) Field of Classification Search ................ 716/18, 716/16
See application file for complete search history.

(56) References Cited

U.S. PATENT DOCUMENTS

| | | | |
|---|---|---|---|
| 5,825,202 A | 10/1998 | Tavana et al. | |
| 5,841,295 A * | 11/1998 | Kaviani | 326/39 |
| 5,874,834 A | 2/1999 | New | |
| 6,091,262 A | 7/2000 | New | |
| 6,094,065 A | 7/2000 | Tavana et al. | |
| 6,223,326 B1 * | 4/2001 | Fields et al. | 716/4 |
| 6,242,945 B1 | 6/2001 | New | |
| 6,400,180 B2 * | 6/2002 | Wittig et al. | 326/41 |
| 6,490,707 B1 | 12/2002 | Baxter | |
| 6,515,509 B1 | 2/2003 | Baxter | |
| 6,526,563 B1 | 2/2003 | Baxter | |
| 7,019,557 B2 * | 3/2006 | Madurawe | 326/38 |
| 2004/0111691 A1 | 6/2004 | Tan et al. | |
| 2004/0153301 A1 * | 8/2004 | Isaacs et al. | 703/14 |
| 2004/0261052 A1 | 12/2004 | Perry et al. | |

OTHER PUBLICATIONS

"LCELL WYSIWYG Description for the Stratix II Family", Version 1.1, Altera Corporation, Mar. 22, 2004.
U.S. Appl. No. 10/861,585, filed Jun. 4, 2004, Foo.
U.S. Appl. No. 10/884,460, filed Jul. 2, 2004, Chua et al.
U.S. Appl. No. 10/916,305, filed Aug. 11, 2004, Yuan et al.

* cited by examiner

*Primary Examiner*—Jack Chiang
*Assistant Examiner*—Brandon Bowers
(74) *Attorney, Agent, or Firm*—Ropes & Gray LLP; Robert R. Jackson (57) ABSTRACT

An FPGA equivalent of a structured ASIC implementation of a user's logic design is produced by taking advantage of various aspects of the way in which the structured ASIC implementation was produced. For example, the structured ASIC breaks the user's logic design down into blocks that are readily implemented in basic units of the FPGA circuitry. Starting from such an acceptable ASIC mapping of the user's logic, resynthesis for FPGA implementation can be performed, at least as a first step, on a block-by-block basis. The FPGA implementation can then be made more economical and efficient by looking for blocks that can be combined in individual basic units of the FPGA circuitry.

18 Claims, 9 Drawing Sheets

METHODS FOR PRODUCING EQUIVALENT LOGIC DESIGNS FOR FPGAS AND STRUCTURED ASIC DEVICES

BACKGROUND OF THE INVENTION

This invention relates to programmable logic devices ("PLDs"), especially field programmable logic devices, which are often called field programmable gate arrays or FPGAs. More particularly, the invention relates to methods for producing configuration data for an FPGA that will make the FPGA function as a close operational equivalent to a structured ASIC that has been designed to implement logic desired by a user.

Chua et al. U.S. patent application Ser. No. 10/884,460, filed Jul. 2, 2004, shows examples of structured, application-specific, integrated circuits ("structured ASICs") that can be fabricated to perform logic that may have been initially implemented in an FPGA to which the structured ASIC is somewhat structurally related. The Chua et al. ASICs are said to be structured because they include some basic logic circuit building blocks or units that can be made to perform various functions by customizing only a subset of the masks used to make the ASIC. These basic ASIC building blocks can also be interconnected in many different ways, again by customizing only a subset of the masks used to make the ASIC. The ASIC building blocks are not one-for-one equivalents to the basic building blocks or units in the related FPGA, but functions performed by an FPGA building block can generally be provided in the ASIC by one or a relatively small number of adjacent or nearby ASIC building blocks. This approach facilitates the design of an ASIC for performing logic that may have been initially implemented in an FPGA. For example, the number of ASIC masks that have to be customized is reduced, which lowers ASIC design cost, speeds the ASIC design process, and reduces the risk that the ASIC will not perform as desired (e.g., as a close operational equivalent to a related FPGA performing the same logic). Using ASIC building blocks that are less than one-for-one equivalents of FPGA building blocks, but that can be clustered (if necessary) to perform the functions of an FPGA building block, allows the ASIC to use only as many of its building blocks as are necessary to implement the functions of each FPGA building block. Because most logic designs use only some of the full functionality of each FPGA building block, this generally allows the ASIC to be smaller than it would be if its building blocks were each as fully featured as an FPGA building block.

The Chua et al. reference includes some technology related to providing FPGA and ASIC implementations of a user's logic that are close operational equivalents of one another. Yuan et al. U.S. patent application 10/916,305, filed Aug. 11, 2004, provides additional technology related to converting a user's FPGA logic to ASIC logic that is a close operational equivalent. The advantages of this type of technology are great. Some of those advantages are identified above. Improvements, extensions, and enhancements are therefore always sought.

SUMMARY OF THE INVENTION

The present invention facilitates producing an FPGA equivalent to a structured ASIC implementation of a user's logic design by requiring the structured ASIC implementation to be based on subdivision of the logic design into blocks, each of which can be implemented in a basic unit of the FPGA circuitry. For example, if a basic unit of the FPGA circuitry can implement, in general, combinational functions having six or fewer inputs, then the user's combinational logic is preferably subdivided into blocks having six or fewer inputs for structured ASIC implementation. Producing an equivalent FPGA implementation in accordance with this invention involves starting from an acceptable structured ASIC mapping of the user's logic as described in the preceding sentences. The above-mentioned blocks in the user's logic can be identified in the ASIC mapping, and each block can be resynthesized for implementation in a basic unit of the FPGA circuitry. Blocks that do not require all the functionality of an FPGA basic unit may be implemented together in one such basic unit. Other functions that may be combined in one FPGA basic unit include combinational logic feeding arithmetic chain data, and/or registers that store the results of combinational logic.

Certain kinds of special-purpose blocks such as input/output ("I/O") blocks, memory ("RAM") blocks, phase-locked loop ("PLL") blocks, digital signal processing ("DSP") blocks, and the like may be provided with the same functionality in both the structured ASIC and FPGA architectures so that these blocks can simply be translated or substituted one-for-one in going from an ASIC implementation to an FPGA implementation.

If the logic design includes a register with a synchronous operational aspect (e.g., synchronous clear, synchronous load, and/or clock enable), resynthesis of the design from ASIC implementation for FPGA implementation may include determining whether the register should by resynthesized (1) to share its synchronous operational aspect(s) with other registers or (2) with its synchronous operational aspect(s) implemented by combinational logic. In the latter case, the resynthesis may further include attempting to include the combinational logic in a basic unit of the FPGA feeding the register.

Further features of the invention, its nature and various advantages will be more apparent from the accompanying drawings and the following detailed description.

DETAILED DESCRIPTION

Figure 1:
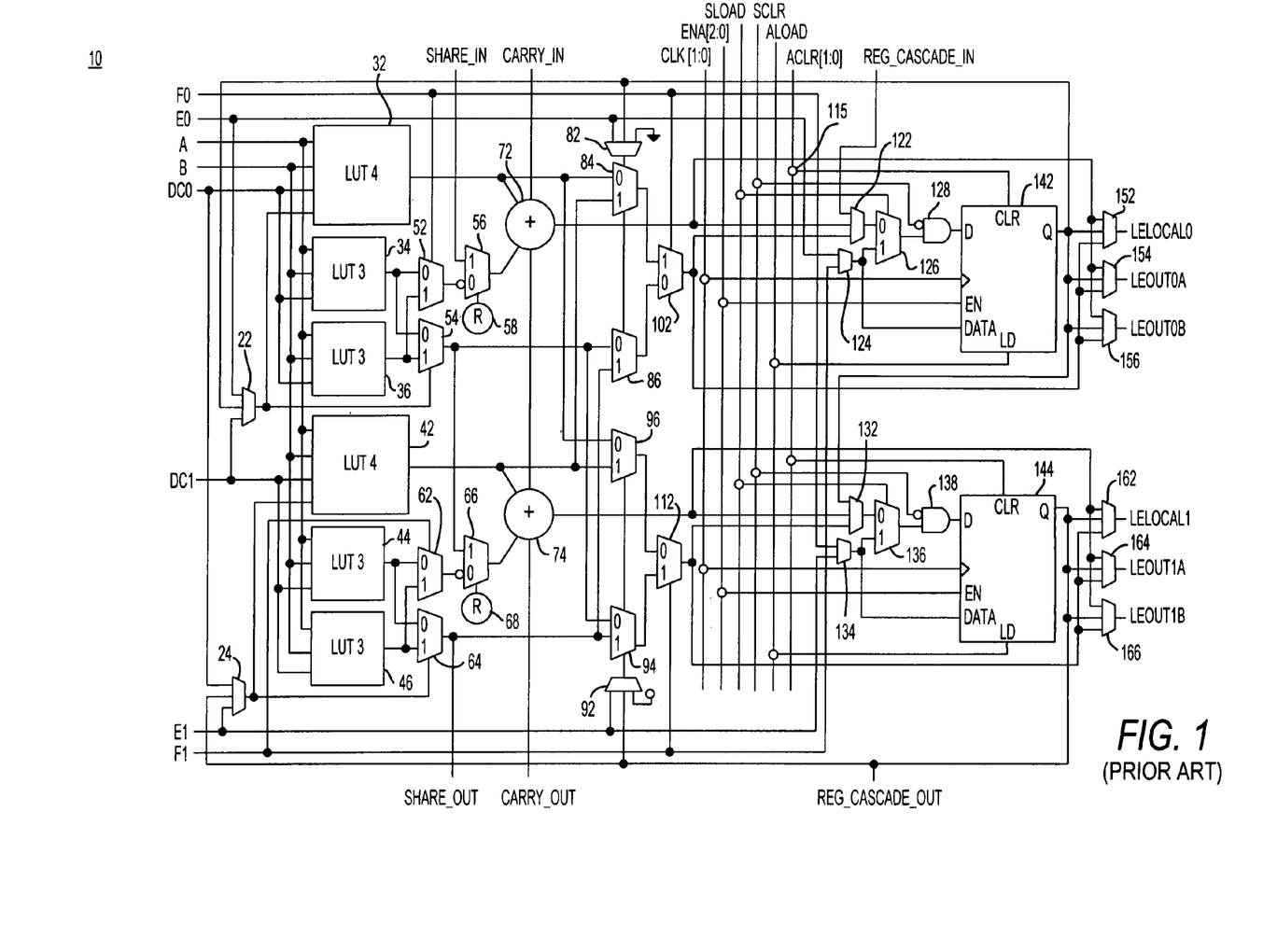
FIG. 1 is a simplified schematic block diagram of an illustrative basic unit of FPGA circuitry that is known to those skilled in the art.

An illustrative example of a basic logic circuit building block or unit 10 for inclusion in an FPGA is shown in FIG. 1. This FPGA building block circuitry (also sometimes referred to as an advanced logic element ("ALE") or an advanced logic module ("ALM")) is known to those skilled in the art and can therefore be described in a somewhat abbreviated way herein. ALE 10 includes multiplexers 22, 24, 52, 54, 56, 62, 64, 66, 82, 84, 86, 92, 94, 96, 102, 112, 122, 124, 126, 132, 134, 136, 152, 154, 156, 162, 164, and 166. Most of these multiplexers are programmably controlled by programmable random access memory ("RAM") bits that are generally not shown in the drawings (although RAM bits 58 and 68 in FIG. 1 are illustrative). Some of these multiplexers are more dynamically controlled by signals that can change during normal operation of the device. Multiplexer 112 is an example of this latter type of multiplexer. It is controlled by input F1 to ALE 10.

ALE 10 also includes look-up tables ("LUTs") 32, 34, 36, 42, 44, and 46. LUTs 32 and 42 are four-input look-up tables. The other LUTs are three-input look-up tables. Each of these LUTs is programmable to provide an output signal that is any logical combination of the input signals to that LUT.

Other components of ALE 10 are full adders 72 and 74, AND gates 128 and 138, and flip-flops 142 and 144. The conductor interconnections shown by open circles (e.g., connection 115) are programmable interconnections, which means that the interconnection may or may not be made, as desired by the user.

The LUT resources of ALE 10 are sufficient to enable the ALE to form any logical combination of up to six inputs to the ALE. Alternatively, if two somewhat smaller functions have some inputs in common, then the LUT resources of ALE 10 may be sufficient to perform two such functions. For example, it may be possible for an ALE 10 to form two five-input combinations, two-four input combinations, etc.

Full adders 72 and 74 enhance the arithmetic capabilities of ALE 10. For example, these components give ALE 10 the ability to perform two adjacent places of the binary addition of two numbers, including the handling of carry in and carry out signals.

Registers 142 and 144 (and associated circuitry) allow signals in ALE 10 to be either registered (by a register) or unregistered (bypassing a register). An ALE 10 register does not have to be used to register a signal originating in the ALE. A register can instead be used (in so-called lonely register mode) to register an input signal to the ALE. Other circuitry of the ALE can be used for other purposes while one or both of registers 142 and 144 are used in lonely register mode. Registers 142 and 144 are also capable of operating in different asynchronous or synchronous modes. "D" is the normal data input to each register; "DATA" is the asynchronous load data.

Figure 2:
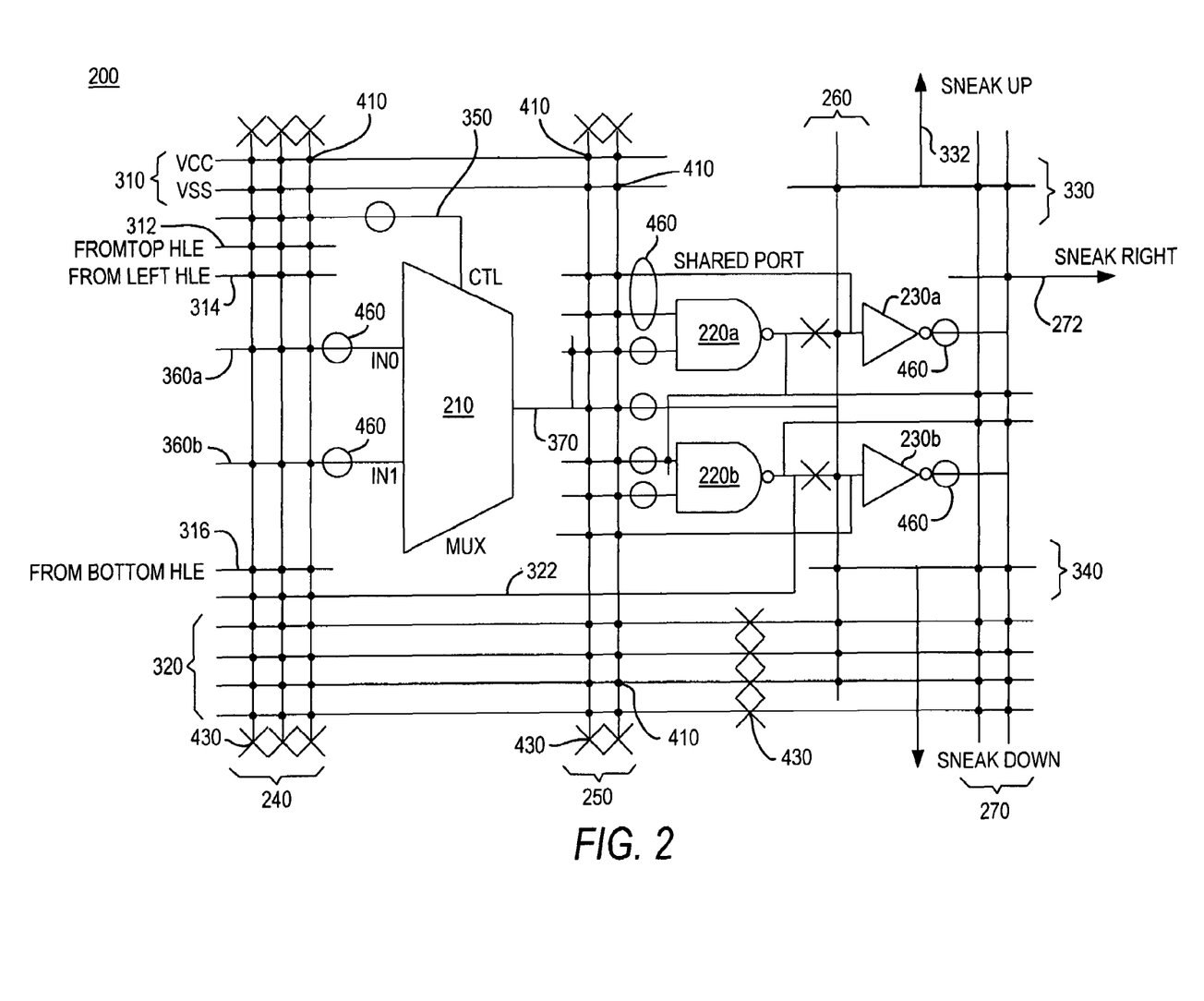
FIG. 2 is a simplified schematic block diagram of an illustrative basic unit of structured ASIC circuitry that is useful in explaining certain aspects of the invention.

FIG. 2 shows an example of a basic logic circuit building block or unit 200 for inclusion in a structured ASIC. FIG. 2 herein is the same as FIG. 3 in the above-mentioned Chua et al. reference. Accordingly, the description of FIG. 2 can be somewhat abbreviated herein. Building block 200 may also be referred to as a hybrid logic element or HLE.

HLE 200 includes two-input multiplexer 210, NAND gates 220a and 220b, and inverters 230a and 230b. HLE 200 also includes some interconnection resources, some of which are mask programmable. For example, Xs identify locations at which conductor segments can be connected to one another or not, as desired, by appropriately customizing a mask (or masks) used to make the ASIC. Similarly, Os identify locations at which connections can be made, if desired, to one or more circuit layers (not shown) in which relatively long-distance interconnection conductors can be provided. Again, these connections and inter-connections are made by appropriately customizing one or more of the masks used to make the ASIC. The solid dots at conductor intersections in FIG. 2 are also connections that can be made or not made, as desired, between the intersecting conductors. Once again, these connections are made, if desired, by appropriately customizing one or more of the masks used to make the ASIC.

Figure 3:
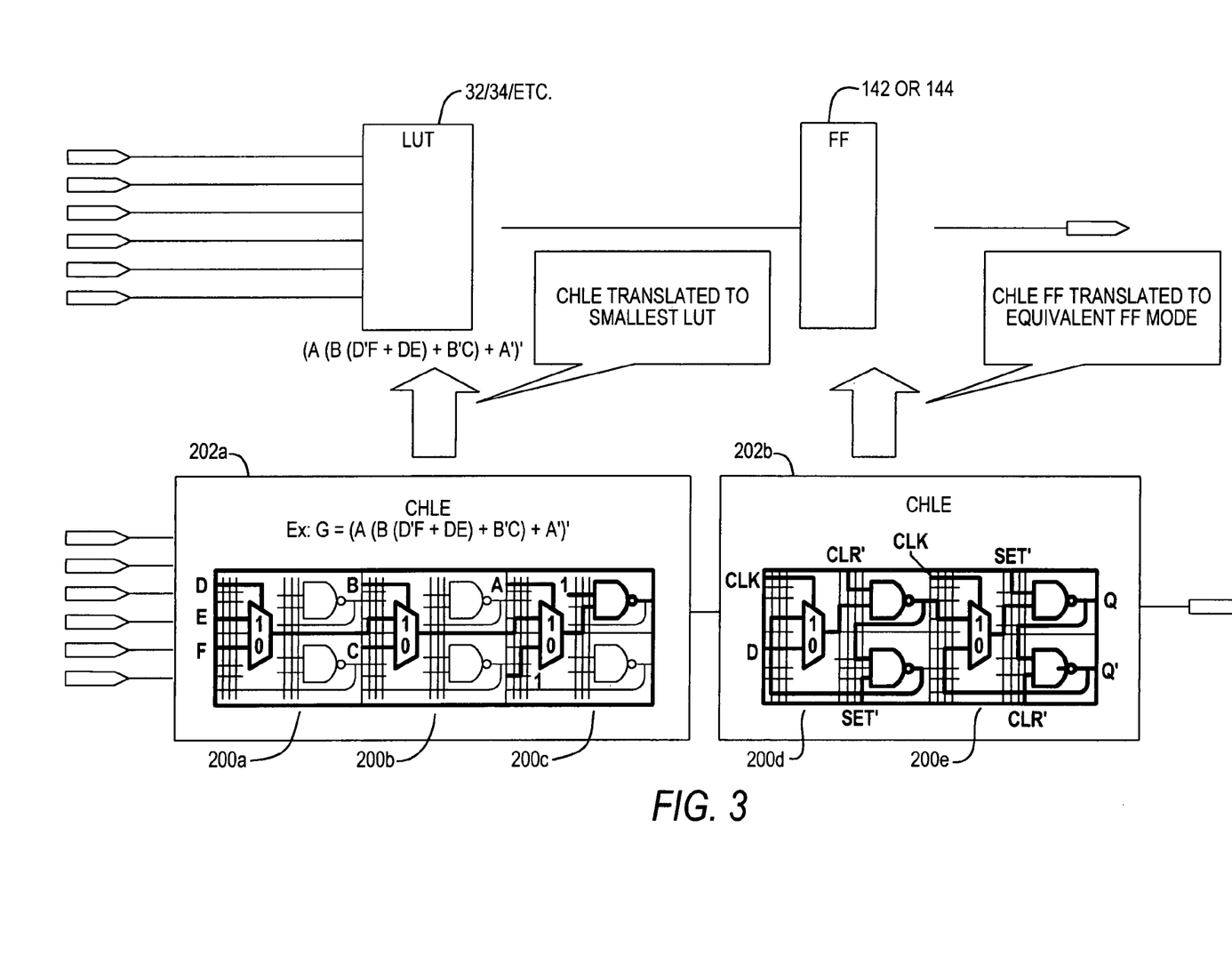
FIG. 3 is a simplified schematic block diagram showing equivalent implementations of certain circuit functions in structured ASIC and FPGA circuitry.

It will be apparent that the logic capabilities of HLE 200 are much less than the logic capabilities of ALE 10 (FIG. 1). However, a relatively small number of adjacent or nearby HLEs can generally be put together to perform any function(s) that an ALE is performing in a user's logic design that has been implemented in an FPGA. FIG. 3, for example, shows the equivalence between three HLEs 200a, b, and c and the LUT circuitry 32/34/ETC. of an ALE 10 performing a particular six-input logical combination. FIG. 3 also shows the equivalence between two more HLEs 200d and e and flip-flop circuitry 142 or 144 of an ALE 10 (which can be the same ALE as is performing the six-input logical combination shown in FIG. 3). It should be understood that HLEs 200a-e are shown greatly simplified in FIG. 3. For the most part only the HLE circuit elements and connections that are actually in use are shown in FIG. 3. All the other HLE circuitry that is shown in FIG. 2 is actually present in each HLE 200a-e, but some of this detail is omitted from the FIG. 3 depiction (or shown using lighter lines) to simplify FIG. 3. Multiple HLEs 200 that are used together (e.g., to perform combinational logic equivalent to what can be performed in LUT circuitry of an ALE, or to perform a register function equivalent to what can be performed in flip-flop circuitry of an ALE) may be referred to as a cluster of HLEs or CHLE. FIG. 3 therefore shows two CHLEs 202a and 202b.

This invention addresses the desirability of being able to derive, from a design for a structured ASIC that will perform logic desired by a user, configuration data for an FPGA that will cause the FPGA to perform that same logic in a manner that is very close to operation of the structured ASIC. This may mean, for example, that the pin-outs of both the structured ASIC and the FPGA are the same, that the timing characteristics of the structured ASIC and the FPGA are the same, and so on, so that the structured ASIC and the FPGA can be substituted for one another in host circuitry with little or no need for change of the host circuitry. Alternatively or in addition, meeting other objectives may be facilitated by the invention. An example of another objective that may be facilitated is lowering FPGA design cost by automating conversion from an ASIC design that has already been done. If the ASIC design has been proven, the FPGA design produced from it in accordance with this invention will also be effectively proven.

Before proceeding further it should be mentioned that in addition to having many ALEs, an FPGA may also have a number of instances of other types of circuitry. Examples of such other types of circuitry include (but are not limited to) input/output ("I/O") blocks, memory blocks, digital signal processing ("DSP") blocks, phase-locked loop ("PLL") and digital phase-locked loop ("DPLL") blocks, and other types of processor circuitry. Such blocks may sometimes be referred to as hard blocks or hard IP blocks. A structured ASIC device may also have (in addition to many HLEs) the same hard circuit blocks. As will be seen, inclusion of the same hard blocks in structured ASICs and FPGAs that can provide equivalents of one another greatly facilitates providing such equivalents in accordance with this invention.

Figure 4:
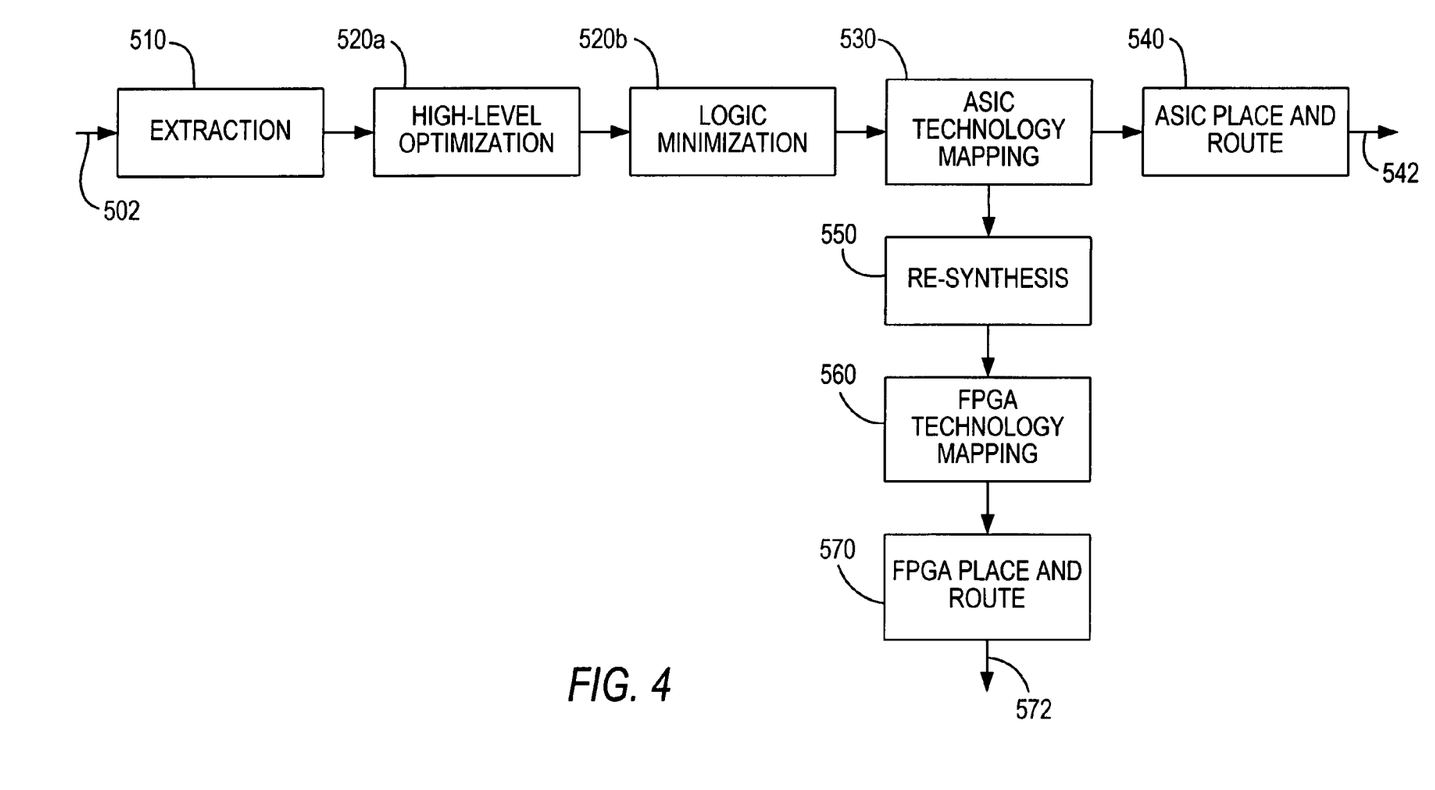
FIG. 4 is a simplified flow diagram of an illustrative embodiment of methods for producing FPGA equivalents to structured ASICs in accordance with the invention.

An illustrative design flow that includes steps (in accordance with the invention) for producing an FPGA equivalent to a user's structured ASIC design is shown in FIG. 4. The steps in the horizontal row across the top of FIG. 4 are the steps that implement the user's logic design in the structured ASIC. The steps below the top row are those that produce an equivalent of the user's structured ASIC design in the FPGA.

Input 502 in FIG. 4 is a specification of logic a user wants to implement. This specification can be in any of several conventional forms such as Verilog, VHDL, or the like. Extraction step 510 takes the user's HDL source and translates it into a netlist that is a mixture of simple logic gates, registers, and operators like adders, multipliers, encoders, decoders, and multiplexers.

High-level optimization step 520a takes this netlist and translates it into a netlist of only simple gates, registers, and some hard blocks like arithmetic chains, DSP blocks, and memory blocks. Logic minimization step 520b takes the netlist of simple gates, registers, and hard blocks, and tries to minimize the simple gates such that a netlist results that is better for structured ASIC and FPGA technology mapping.

ASIC technology mapping step 530 maps the netlist from step 520b to the HLEs and hard blocks of the structured ASIC. Step 530 preferably does this in a way that anticipates a possible need to produce an equivalent FPGA implementation of the same logic. Thus, in accordance with this invention, step 530 uses a predetermined library of logic functions, each of which functions can be implemented in either (1) one FPGA ALE or (2) one structured ASIC HLE or a relatively small number of adjacent or nearby structured ASIC HLEs (i.e., a CHLE). For example, the maximum number of HLEs that may be permitted in a CHLE may be six, but of course this number may be larger or smaller in other embodiments of the invention. The library of functions used in step 530 may be much larger than the library of functions typically used in prior art technology mapping steps. Such prior art technology mapping may use a library of 100-200 functions. In contrast, step 530 may use a library of several thousand (e.g., 18,000-20,000) functions. In the illustrative embodiment being described the library of functions used in step 530 includes all two-input, three-input, and four-input functions, as well as many common (but not all) five-input and six-input functions. Step 530 maps the logic from step 520b to instances of the available library functions, each of which (as noted earlier) has a known (library) implementation in an HLE or CHLE. This is done by looking for portions of the netlist that can be implemented by the available library functions. An illustrative CHLE of this kind is shown on the left (as CHLE 202a) in FIG. 3. The registers from step 520b are also mapped to CHLEs in step 530, preferably again using predetermined library functions for registers. An illustrative CHLE of this kind is shown on the right (as CHLE 202b) in FIG. 3. Hard blocks from step 520b are mapped to structured ASIC hard block circuit resources by step 530.

To complete the top row of steps shown in FIG. 4, ASIC place and route step 540 locates the mapping from step 530 on a particular structured ASIC product. The output 542 from step 540 can be used by further software and hardware to customize the masks used to make a structured ASIC that will perform the user's logic.

Some additional discussion that relates primarily to step 530 will now be provided. For hard blocks such as memory (e.g., RAM), DSP, PLL, and I/O, the step 530 ASIC library builders for these blocks are preferably functionally identical to those for an FPGA implementation. FPGAs typically have global clock networks that are pre-built and limited in various respects. The step 530 ASIC library builders for clock signal networks need to observe these constraints. Also, FPGAs typically operate with clock enables rather than with gated clocks, and the step 530 ASIC library builder needs to prefer clock enables over gated clocks.

Continuing with the further discussion of step 530, with regard to random combinational logic the library is (at least in this embodiment, and as noted above) limited to six-input functions. However, because of the possibility (also noted above) that two five-input functions can be packed into one ALE if there is some appropriate input commonality, the step 530 ASIC library builder is preferably set up to prefer five-input functions over six-input functions. In particular, step 530 is preferably biased in favor of using library functions in the following order of desirability: five-input, six-input, four-input, three-input, two-input, and one-input.

Figure 5:
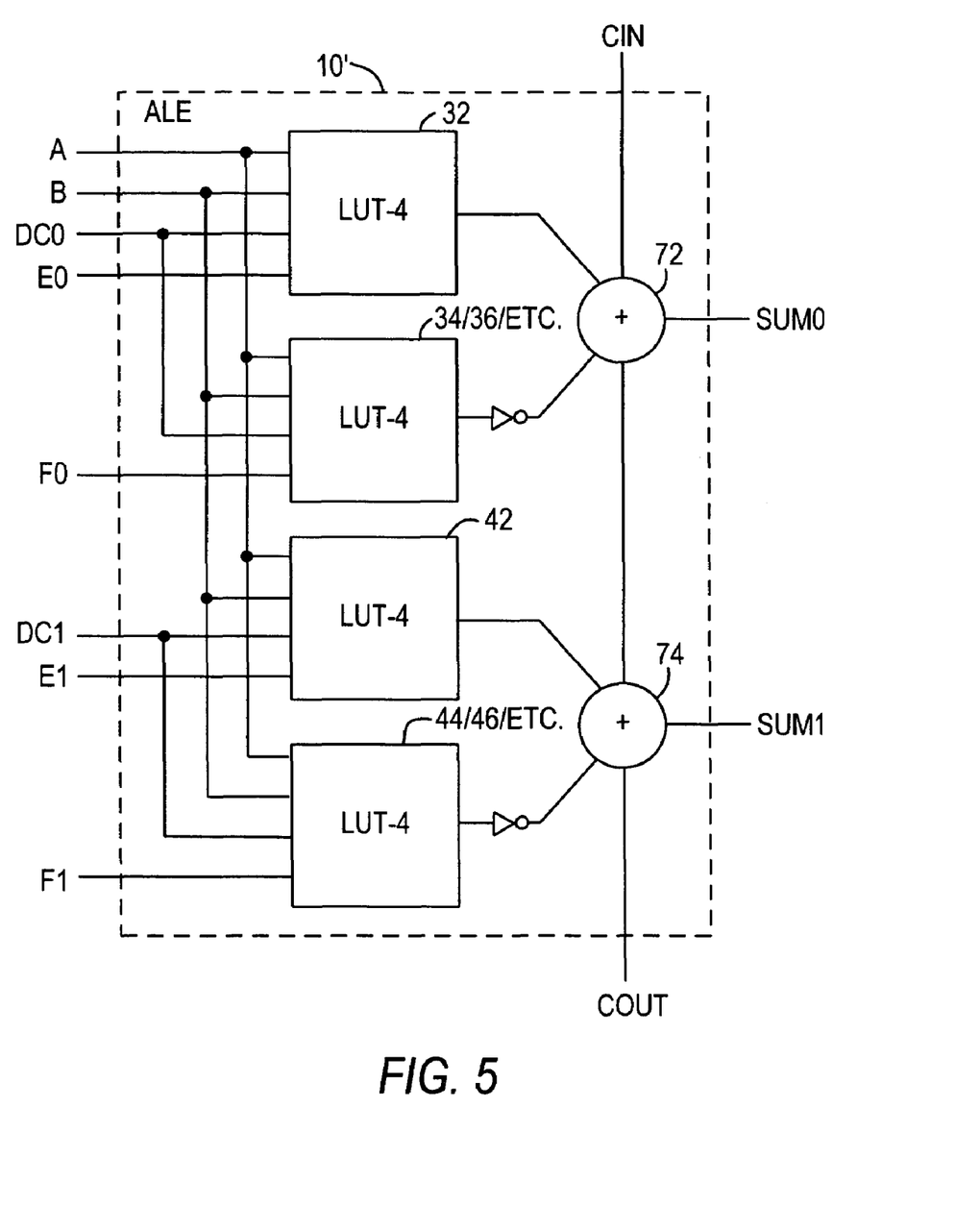
FIG. 5 shows an illustrative configuration/use of circuitry of the type shown in FIG. 1.

Another aspect of FPGA characteristics that the step 530 ASIC library builder preferably observes relates to implementing data paths in the ASIC. FIG. 5 shows an FPGA ALE 10' configured in arithmetic mode. ALE 10' is the same as ALE 10 (FIG. 1), but ALE 10' is shown configured to perform the desired arithmetic functions. Full adder 72 can add two binary digits (respectively supplied from LUT 32 and LUT 34/36/ETC.) and a carry in ("CIN") digit to produce a SUM0 output signal and a carry out signal that goes on to full adder 74. Full adder 74 can add two more binary digits (respectively supplied from LUT 42 and LUT 44/46/ETC.) and the carry out digit from full adder 72 to produce a SUM1 output signal and a carry out ("COUT") signal. ALE 10' has several rules regarding its signals: (1) COUT must drive CIN (internally within ALE 10' (i.e., from full adder 72 to full adder 74) and externally (i.e., from one ALE 10' to the next ALE 10' in a carry chain)); (2) inputs A and B are common to both atoms (making common control signals like a multiplexer ("mux") select or add/subtract ("ADD/!SUB") good choices for these signals; and (3) the other three inputs to each half of the ALE are unique.

Figure 6:
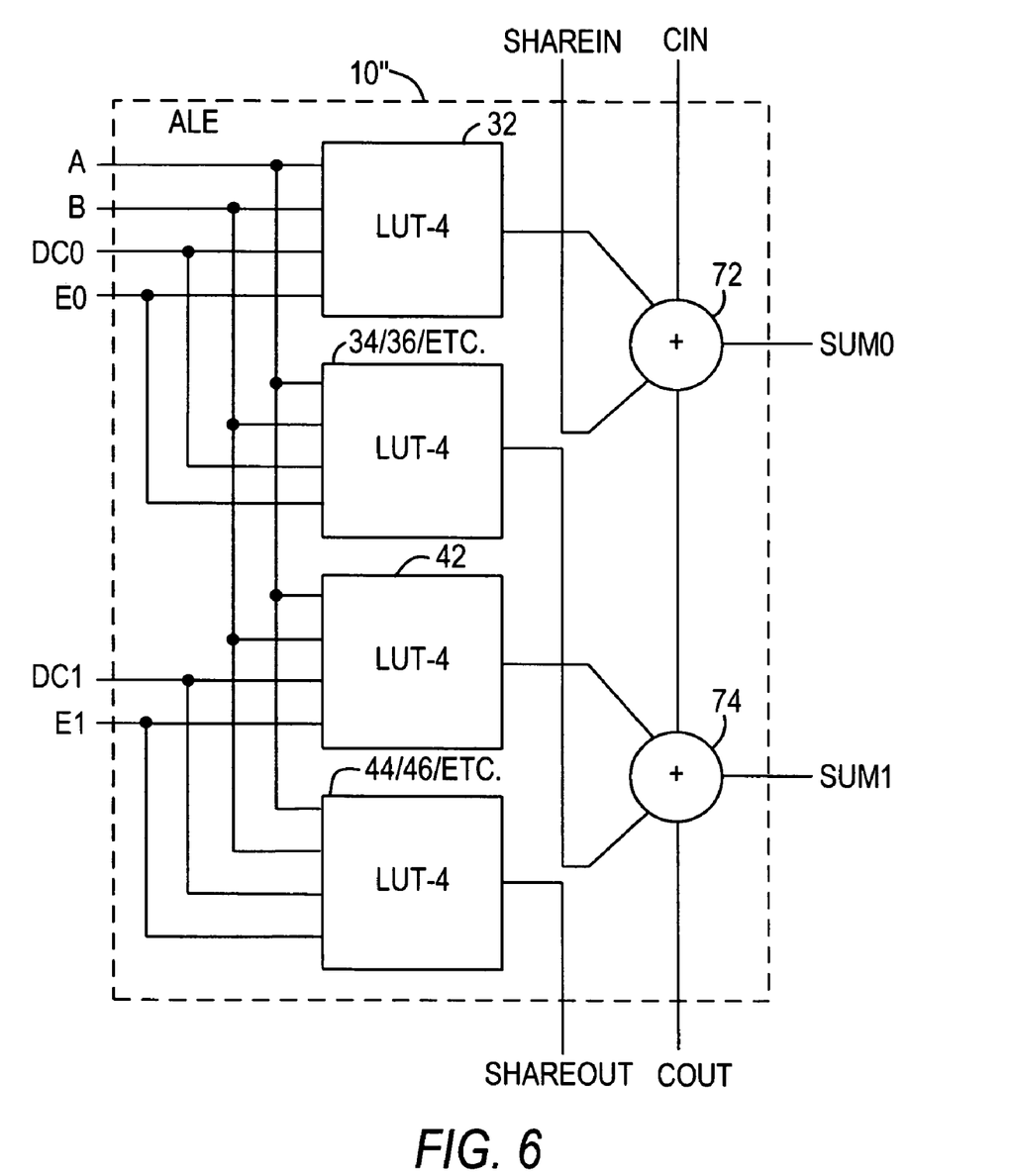
FIG. 6 shows another illustrative configuration/use of circuitry of the type shown in FIG. 1.

FIG. 6 shows another possible arithmetic mode configuration of an ALE 10". This is so-called shared arithmetic mode. Again, ALE 10" can be an instance of ALE 10 (FIG. 1), but configured for shared arithmetic mode. Shared arithmetic mode is used to implement a carry save adder. This is a mode in which separate vectors for sum and carry are produced, and then these vectors are added to get the final result. In this embodiment the LUTs 32, etc., are forming the vectors, and full adders 72 and 74 are forming two binary places of the final result. Like ALE 10' (FIG. 5), ALE 10" has several rules regarding its signals: (1) COUT must drive CIN; (2) SHAREOUT must drive SHAREIN; (3) A and B are common to both atoms; (4) the other two inputs to each half of the ALE are unique; and (5) A+B+C requires three unique signals for each atom (e.g., A, DC0, E0 for the upper LUTs; B, DC1, E1 for the lower LUTs).

With the above discussion of FIGS. 5 and 6 as background, it will be apparent that when implementing data paths in the ASIC, the step 530 ASIC library builder should preferably observe the above-described rules for arithmetic mode or shared arithmetic mode ALEs. For example, the step 530 ASIC library builder should match FPGA carry chain limits. This includes such considerations as matching adder types (full or half adders), observing constraints on inputs to an ALE, and observing limits on carry and/or share chain connections.

Still another aspect of FPGA characteristics that the step 530 ASIC library builder should preferably observe relates to implementing registers, In the illustrative embodiment being described, FPGA registers 142 and 144 (FIG. 1) are D-type flip-flops ("DFFs"). They have clock, asynchronous clear ("async-clear"), asynchronous load ("async-load"), clock enable, synchronous clear ("sync-clear"), and synchronous load ("sync-load") capabilities. They are also grouped together in groups called logic array blocks ("LABs") of a predetermined number of ALEs (e.g., eight, ten, 16, etc., ALEs) which share a subset of the globally available control signals (e.g., clock, clear, load, etc.). In implementing registers for the ASIC, the step 530 ASIC library builder should preferably observe and conform to these FPGA register characteristics.

This concludes the discussion of the top row of steps in FIG. 4. We turn now to the steps (550-570) below the top row that are used in accordance with the invention to produce a configuration for an FPGA that will be equivalent to the structured ASIC that results from the top row of steps. An overview of steps 550-570 will be provided next. More details will be provided later (e.g., with reference to FIGS. 7a and 7b).

Step 550 starts from the ASIC mapping produced in step 530 and resynthesizes that mapping (to the extent necessary), to make it more suitable for implementation in an FPGA. Some portions of the ASIC mapping from step 530 need little or no resynthesis. This is true, for example, for the hard blocks, which can be remapped one-for-one to the FPGA. Other portions of the ASIC mapping from step 530 may need more resynthesis. This is true, for example, for the combinational logic. Even in the case of combinational logic, however, the resynthesis performed in step 550 is preferably limited. For example, decomposition of the logic functions that have been associated with the step 530 ASIC library builders is preferably avoided. This takes advantage of the fact that each such combinational logic ASIC library builder function can be implemented in the combinational logic of one FPGA ALE.

Step 560 takes the mapping from step 550 and maps it to a particular FPGA technology. For example, in the illustrative embodiment being discussed, an FPGA ALE can sometimes perform multiple combinational logic functions, each of which has fewer than five inputs. Accordingly, step 560 may include looking for multiple combinational logic functions that can be implemented in one FPGA ALE in this fashion.

FPGA place and route step 570 locates the mapping from step 560 on a particular FPGA product. The output 572 from step 570 can be used by assembler hardware and software to actually configure (program) an FPGA so that it will perform functions equivalent to the functions performed by a structured ASIC produced from the output 542 of step 540.

Figure 7A:
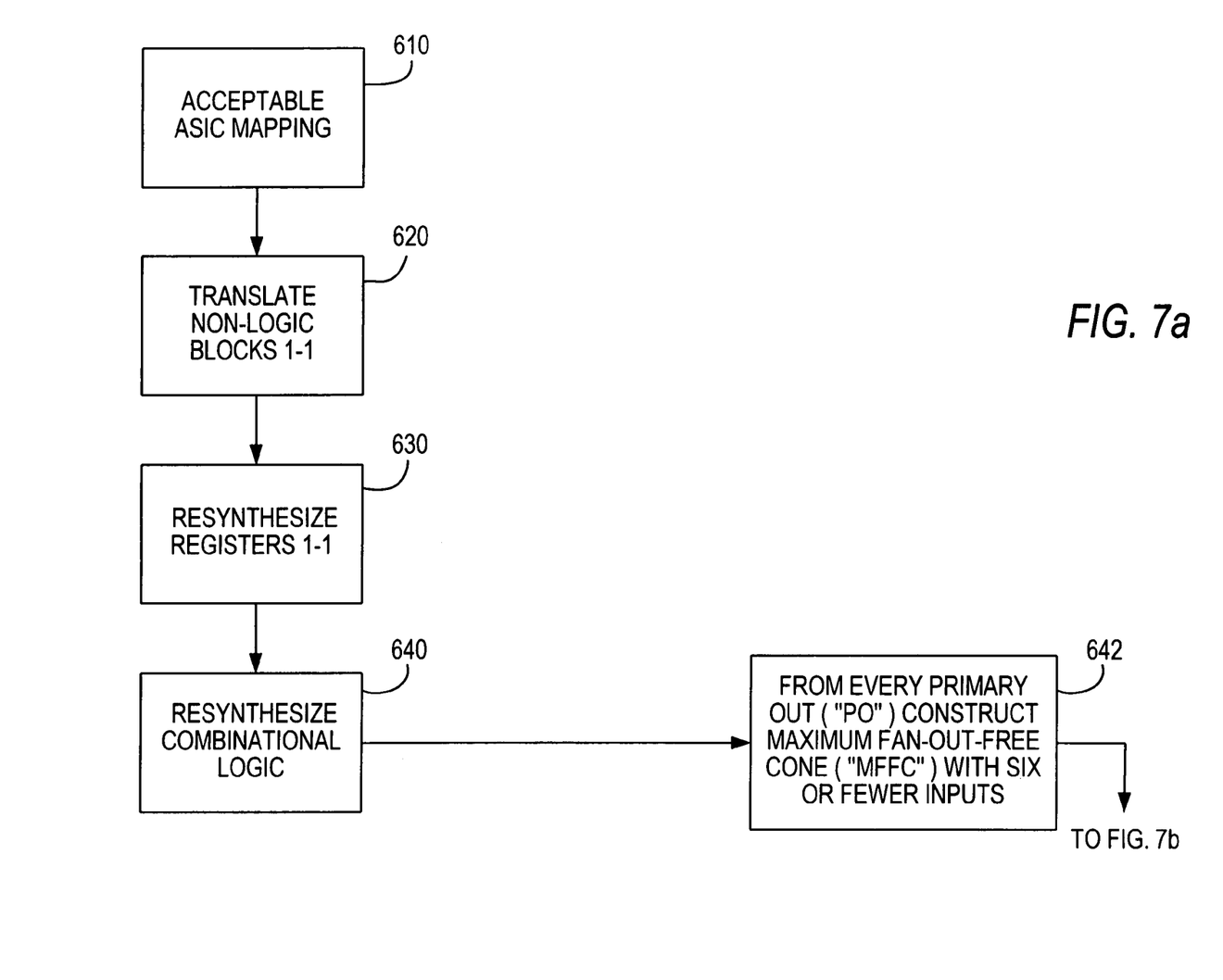
FIGS. 7*a* and 7*b* are simplified flow diagrams showing an illustrative embodiment of portions of FIG. 4 in more detail.
Figure 7B:
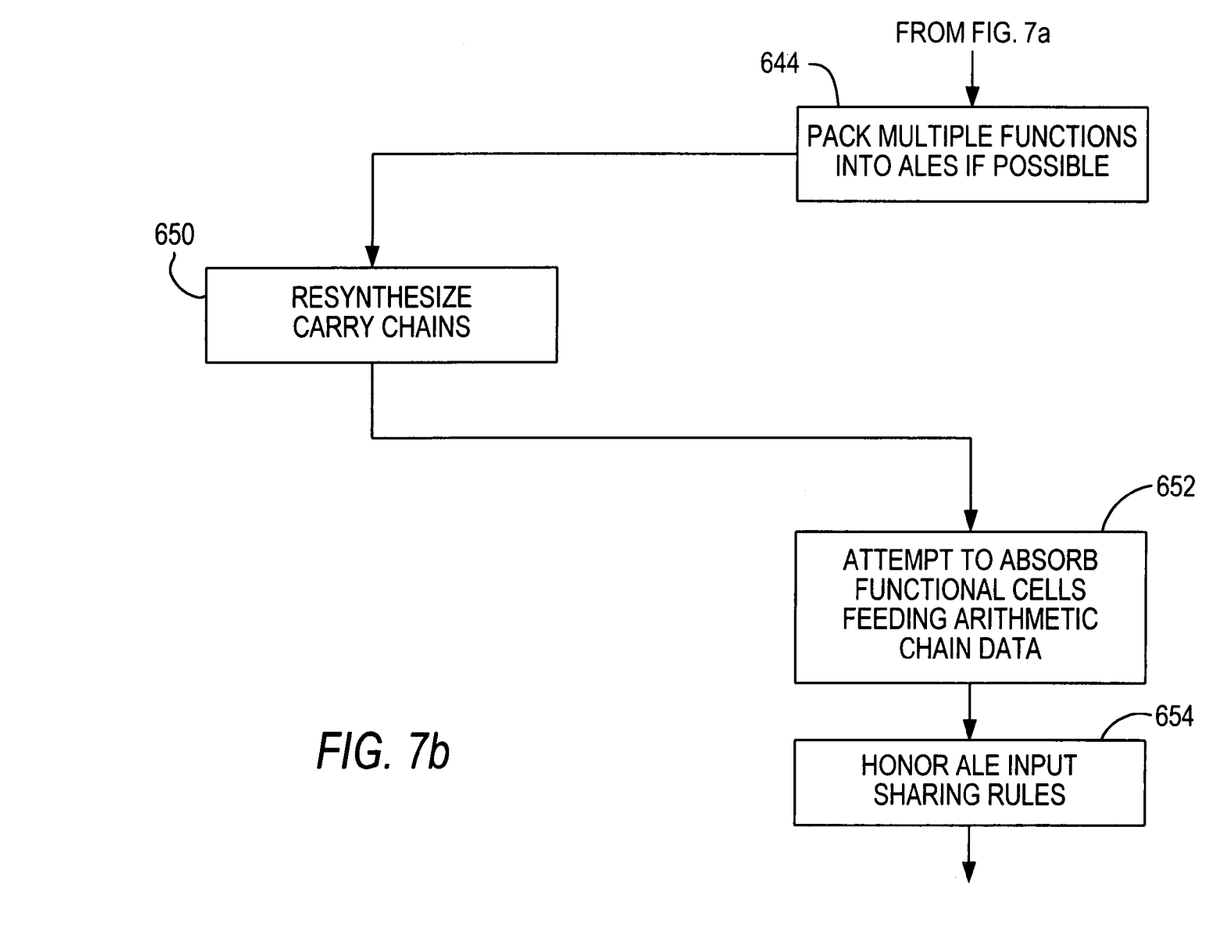

FIGS. 7a and 7b show an illustrative embodiment of what can be done in steps 550 and 560 in more detail. The process begins with an acceptable ASIC mapping 610, which is a product of step 530 as described earlier in this specification.

In step 620, non-logic blocks from ASIC mapping 610 are translated one-for-one to corresponding FPGA non-logic blocks. Examples of non-logic blocks that may be handled in this way include DSP, RAM, PLL, and I/O blocks, etc. These are blocks that are typically provided with the same functional capabilities in both the structured ASIC architecture and the FPGA architecture. It is therefore a straightforward matter to translate each such block from ASIC mapping 610 to the same type of block in the FPGA mapping that is being constructed in accordance with FIGS. 7a and 7b.

The next step is step 630, in which registers from ASIC mapping 610 are resynthesized one-for-one in ALE registers 142/144. To the extent that it is reasonably possible to do so, such register functions are packed into the ALEs whose other circuitry is providing the signal(s) to be registered.

The next step is 640, in which the general combinational logic from ASIC mapping 610 is resynthesized for FPGA implementation. This can be done as shown, for example, in step 642, in which from every primary output (e.g., a hard IP output, a CHLE output, a register output, or the like) the maximum fan-out-free cone ("MFFC") with six or fewer inputs is constructed. Each such MFFC can be implemented in one ALE. Step 644 is performed in an effort to pack two or more MFFCs having fewer than six inputs into single ALEs.

In step 650 each carry chain from ASIC mapping 610 is resynthesized for FPGA implementation. This means implementing each carry chain in the ASIC mapping as shown in FIG. 5 or FIG. 6, for example, depending on the type of carry chain that it is.

After the carry chains have been resynthesized in step 650, step 652 is performed to attempt to absorb into the ALEs of the carry chains combinational logic feeding the arithmetic chain data. This means looking for combinational logic that can be performed in the LUTs 32, 34, 36, 42, 44, 46, etc. of the ALEs 10' or 10" (FIG. 5 or FIG. 6) implementing the carry chain. As part of this, step 654 is performed to make sure that the ALE input sharing rules are not violated.

Figure 8:
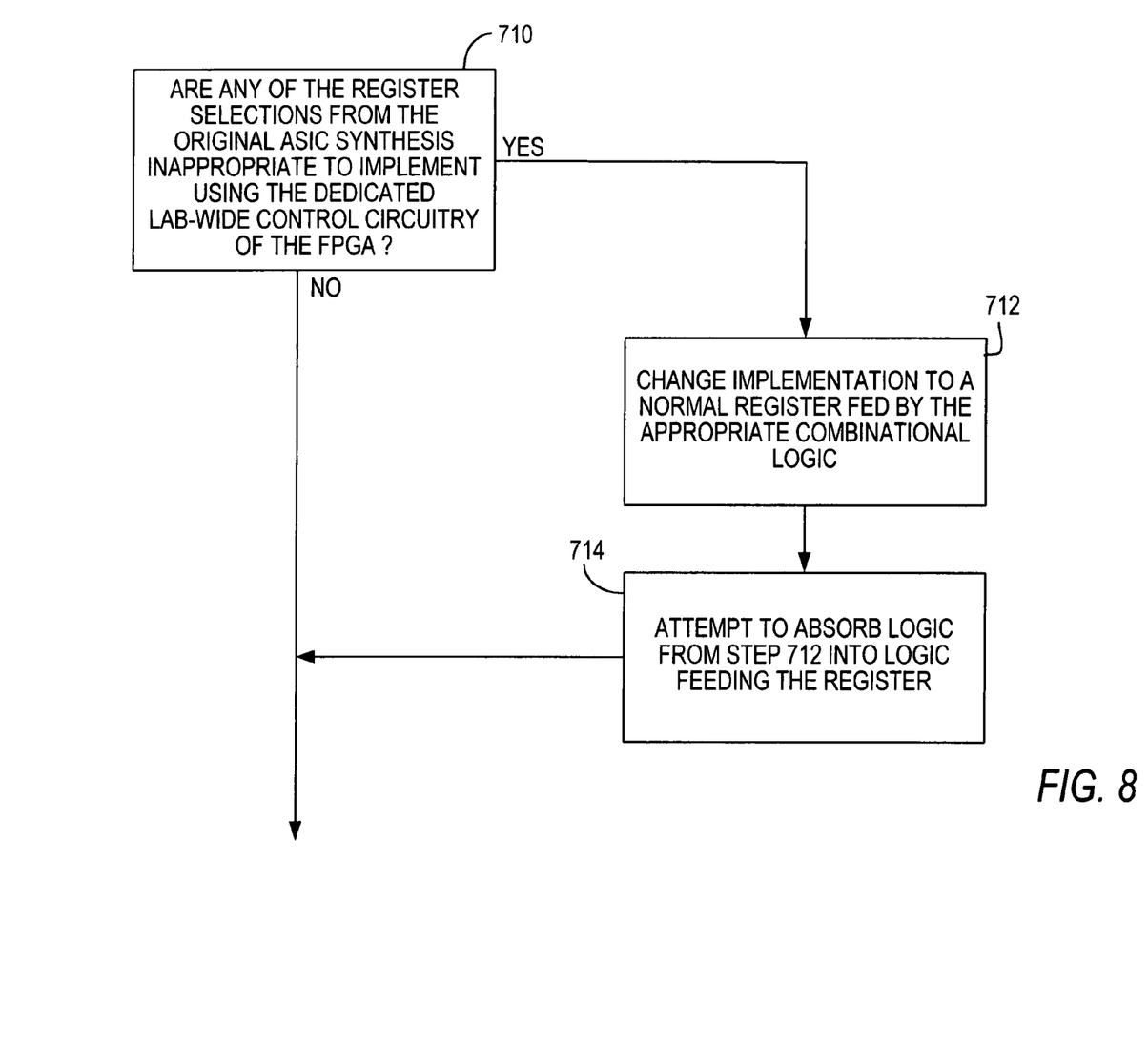
FIG. 8 is a simplified flow diagram showing an illustrative embodiment of steps that can be added to what is shown in FIGS. 7*a* and 7*b*, if desired.

Steps that may be performed as an addition to the flow of FIGS. 7a and 7b are shown in FIG. 8. Many FPGAs have dedicated hardware included to implement synchronous clear and load, as well as clock enable, in their registers. To minimize the cost of this hardware, some of this circuitry may be shared to some extent by several registers (e.g., the registers in several logic elements that are clustered together in what is sometimes referred to as a logic array block or LAB). A consequence of this is that the synchronous control signals should be common to several registers so that they can easily be grouped into LABs. If a design contains many unique or low fan-out synchronous control signals, the LAB utilization may be adversely affected. One solution is to instead implement the synchronous register controls in the normal FPGA logic fabric. For example, synchronous clear is just an AND gate on the register data. Normal FPGA synthesis decides how to implement synchronous register functions (i.e., whether to use the dedicated (but shared) circuitry or normal logic circuitry). The present invention may include steps with a somewhat analogous function as shown in FIG. 8.

In step 710 the ASIC synthesis (from step 530 in FIG. 4) is considered to determine whether any of the register selections from that synthesis are inappropriate to implement using the dedicated LAB-wide control circuitry of the FPGA. If so, step 712 is performed to change the implementation to a normal register fed by the appropriate combinational logic. Then step 714 is performed to try to improve the efficiency of the implementation by attempting to absorb the combinational logic from step 712 into the source logic feeding the register.

After ASIC mapping 610 has been resynthesized for FPGA implementation as shown in FIGS. 7a and 7b (and possibly FIG. 8), step 570 (FIG. 4) can be performed to produce the data needed to actually program an FPGA to implement the FPGA mapping.

Another aspect of the invention relates to providing machine-readable media (e.g., CD-ROM, magnetic tape, or the like) encoded with machine-readable instructions for performing any of the various methods of the invention as shown and described herein.

It will be understood that the foregoing is only illustrative of the principles of the invention, and that various modifications can be made by those skilled in the art without departing from the scope and spirit of the invention. For example, the particular functionality shown for ALEs and HLEs is only illustrative, and ALEs and/or HLEs with greater or lesser functionality can be employed instead if desired. If the functionality of either or both of these types of circuit blocks or units is changed, then some of the details of conversion between ALEs and HLEs, for example, may change. An illustration of this might be an increase or decrease in the maximum number of HLEs permitted in a CHLE. The underlying principles, however, will remain the same.

What is claimed is:

1. A method of producing a field-programmable gate array (FPGA) equivalent to a structured application-specific integrated circuit (ASIC) comprising:
   synthesizing a user's logic design for implementation in a structured ASIC by subdividing the logic design into a plurality of blocks of logic, each of which is implementable in a basic unit of FPGA circuitry;
   mapping each of the blocks to a structured ASIC implementation of that block in the structured ASIC; and
   synthesizing the logic design for FPGA implementation by processing each of the blocks for FPGA implementation in the FPGA equivalent.

2. The method defined in claim 1 wherein the synthesizing the logic design for FPGA implementation comprises:
   processing each of the blocks for implementation in one of the basic units of the FPGA circuitry.

3. The method defined in claim 2 wherein the synthesizing the logic design for FPGA implementation further comprises:
   combining in one of the basic units of the FPGA circuitry multiple ones of the blocks that individually do not utilize all capabilities of a basic unit.

4. The method defined in claim 2 wherein the logic design includes an arithmetic chain that spans multiple ones of the blocks, and wherein, for each of the blocks in the arithmetic chain, the processing each of the blocks for implementation in one of the basic units of the FPGA circuitry comprises:
   utilizing arithmetic chain capabilities of each of the basic units used for each of the blocks in the arithmetic chain.

5. The method defined in claim 4 wherein, for each of the basic units used for each of the blocks in the arithmetic chain, the synthesizing the logic design for FPGA implementation further comprises:
   including in the basic unit logic that feeds data to the carry chain.

6. The method defined in claim 2 wherein the logic design includes a register with a synchronous operational aspect, and wherein the synthesizing the logic design for FPGA implementation comprises:
   determining whether the register should be synthesized to share its synchronous operational aspect with other registers or with its synchronous operational aspect implemented by combinational logic.

7. The method defined in claim 6 wherein, if the synchronous operational aspect of the register is implemented by combinational logic, the synthesizing the logic design for FPGA implementation further comprises:
   including the combinational logic in a basic unit of the FPGA feeding the register.

8. The method defined in claim 6 wherein the synchronous operational aspect is selected from the group consisting of synchronous clear, synchronous load, clock enable, and combinations thereof.

9. Machine-readable media encoded with machine-readable instructions for performing the method defined in claim 1.

10. A method for producing a field-programmable gate array (FPGA) equivalent to a structured application-specific integrated circuit (ASIC) implementation of a user's logic design, which implementation has been produced by subdividing the logic design into a plurality of blocks of logic, each of which is implementable in a basic unit of FPGA circuitry, the method comprising:
    synthesizing the logic design for FPGA implementation by processing each of the blocks for implementation in a respective one of the basic units of the FPGA circuitry.

11. The method defined in claim 10 wherein the synthesizing further comprises:
    combining in one of the basic units of the FPGA circuitry multiple ones of the blocks that individually do not utilize all capabilities of a basic unit.

12. The method defined in claim 10 wherein the logic design includes an arithmetic chain that spans multiple ones of the blocks, and wherein, for each of the blocks in the arithmetic chain, the processing each of the blocks for implementation in one of the basic units of the FPGA circuitry comprises:
    utilizing arithmetic chain capabilities of each of the basic units used for each of the blocks in the arithmetic chain.

13. The method defined in claim 10 wherein the logic design includes a register with a synchronous operational aspect, and wherein the synthesizing comprises:
    determining whether the register should be synthesized (1) to share its synchronous operational aspect with other registers or (2) with its synchronous operational aspect implemented by combinational logic.

14. The method defined in claim 13 wherein, if the synchronous operational aspect of the register is implemented by combinational logic, then the synthesizing further comprises:
    including the combinational logic in a basic unit of the FPGA feeding the register.

15. The method defined in claim 13 wherein the synchronous operational aspect is selected from the group consisting of synchronous clear, synchronous load, clock enable, and combinations thereof.

16. Machine-readable media encoded with machine-readable instructions for performing the method defined in claim 10.

17. A method of providing a field-programmable gate array (FPGA) design that is equivalent to a structured application-specific integrated circuit (ASIC) implementation of a user's logic design, the structured ASIC employing repetitions of a basic unit of ASIC circuitry, each of the repetitions having only a subset of the capabilities of a basic unit of the FPGA circuitry, the logic design being mapped to the structured ASIC in a plurality of blocks of logic, each of the blocks being limited in size to what can be performed by one of the basic units of FPGA circuitry, the method comprising:

converting each of the blocks to implementation in one of the basic units of FPGA circuitry; and combining in one of the basic units of FPGA circuitry multiple ones of the blocks that individually do not utilize all capabilities of a basic unit of FPGA circuitry.

18. Machine-readable media recorded with machine-readable instructions for performing the method defined in claim 17.

* * * * *